Nov. 19, 1968 H. G. GRIMMEISS 3,412,252

INFRARED SENSING BY QUENCHING IN JUNCTION SEMICONDUCTOR

Filed Feb. 15, 1965 2 Sheets-Sheet 1

INVENTOR.
HERMANN G.GRIMMEISS
BY
*[signature]*
AGENT

INVENTOR.
HERMANN G.GRIMMEISS

BY

Frank R. Trifari

AGENT

United States Patent Office 3,412,252

Patented Nov. 19, 1968

3,412,252

INFRARED SENSING BY QUENCHING IN JUNCTION SEMICONDUCTOR

Hermann Georg Grimmeiss, Aachen, Germany, assignor to North American Philips Company Inc., New York, N.Y., a corporation of Delaware Filed Feb. 15, 1965, Ser. No. 432,456
Claims priority, application Netherlands, Feb. 12, 1964, 6401190
5 Claims. (Cl. 250—211)

ABSTRACT OF THE DISCLOSURE

A detector for long wavelength radiation comprising a photosensitive semiconductor having p and n regions forming a p-n junction in an output circuit connected to the p and n regions. Means are provided for irradiating the semiconductor to generate free minority carriers to increase the electrical output. The semiconductor has the property that on being irradiated with the long wavelength radiation, the lifetime of the minority carriers is reduced thereby reducing the electrical output. A very sensitive detector especially for infrared radiation is obtained.

The invention relates to an arrangement for detecting radiation comprising a radiation detector having a photosensitive semiconductor body with a p-n junction and to which body the radiation to be detected is supplied. The invention relates also to a radiation detector for use in such an arrangement.

In such arrangements a photosensitive semiconductor body is provided with two contacts, one on each side of the p-n junction, while the radiation to be detected strikes the semiconductor body in the proximity of the p-n junction, generally within a distance from the p-n junction smaller than a few diffusion lengths of the free charge carriers. The incident radiation produces an electric voltage across the electrodes and/or an electric current in an external circuit between the electrodes, the value of this voltage and/or current being a measure of the intensity of the incident radiation. The p-n junction may be biased in the reverse direction, the current produced by the incident radiation being measured.

The radiation to be detected should be capable of generating free charge carriers in the photosensitive semiconductor body which give rise to a photovoltage and/or photocurrent. The free charge carriers may, for example, be generated by radiation having a quantum energy sufficient to cause electrons in the photosensitive semiconductor body to pass from the valence band into the conduction band. In this process free electrons are produced in the conduction band and free holes in the valence band.

Radiation having a quantum energy sufficient to cause electrons to pass from the valence band into the conduction band has a quantum energy at least equal to the width of the forbidden band in the semiconductor body. This means that in this manner radiation having a large wavelength, such as red and infrared radiation, that is to say, radiation having a small quantum energy, can only be detected by means of a photosensitive semiconductor body with a p-n junction and having a small width of the forbidden band.

Consequently only a small output can be obtained with such a photosensitive semiconductor body, while the temperature-dependence may be comparatively great, for with increasing width of the forbidden band an increasing output may be obtained while generally the temperature-dependence decreases.

It is possible to use a photosensitive semiconductor body having a greater width of the forbidden band by incorporating an impurity in the body which impurity gives rise to a deep-lying intermediate level in the forbidden band so that electrons may be caused to pass from the valence band into the conduction band in two transition steps by way of the intermediate level. Thus, a larger output may be derived while the temperature-dependence is decreased. This, however, gives rise to the disadvantage that for each electron-hole pair to be created not one but two radiation quanta of the radiation to be detected are required, namely one radiation quantum to cause an electron to pass from the valence band to the intermediate level and a second radiation quantum to cause the electron to pass from the intermediate level into the conduction band. Furthermore, the process of creating an electron-hole pair by way of an intermediate level is comparatively inefficient if the radiation to be detected is substantially monochromatic, since generally the two transition steps are different in size.

It is an object of the invention to provide an arrangement for detecting radiation, particularly long-wavelength radiation, such as red and infrared radiation, which has a high sensitivity over a wide wavelength range together with a small temperature-dependence and the possibility of deriving a large output.

According to the invention, an arrangement for detecting radiation comprises a radiation detector having a photosensitive semiconductor body with a p-n junction to which body the radiation to be detected is applied. The photosensitive semiconductor body, at least to one side of the p-n junction, consists of a semiconductor material in which free charge carriers, including minority carriers, may be generated with the aid of radiation, while the lifetime of free minority carriers present in the semiconductor material may be reduced with the aid of radiation having a wavelength larger than that of the radiation which generates the free charge carriers. Provision is made of a radiation source which irradiates the photosensitive semiconductor body with radiation which, at least for a considerable part, consists of the said radiation generating free charge carriers, while the optical signals to be detected are applied to the photosensitive semiconductor body which, at least for a substantial part, consist of the said radiation reducing the lifetime of free minority carriers.

Semiconductor materials are known in which photoconductivity is obtainable by means of radiation while this photoconductivity may be reduced by means of radiation having a wavelength longer than that of the radiation which gives rise to the photoconductivity. In the literature this phenomenon is generally referred to as "quenching."

Although quenching is a generally known phenomenon in photoconductivity, quenching by means of incident radiation of a photocurrent produced in a photosensitive semiconductor body containing a p-n junction has not been proved. The invention is based on the recognition that when photoconductivity is reduced by incident radiation, this reduction is due to the fact that the incident radiation reduces the lifetime of the free charge carriers, which generally are the majority carriers, whereas the photocurrent produced in a photosensitive semiconductor body which contains a p-n junction is highly dependent upon the lifetime of the minority carriers and hence in this case in order to reduce the photocurrent by the incident radiation the lifetime of the minority carriers is to be reduced. In other words, reduction (quenching) by means of incident radiation of a photocurrent produced in a photosensitive semiconductor body which contains a p-n junction may be effected if the photosensitive semiconductor body, at least to one side of the p-n junction, consists of a semiconductor material in which the lifetime of the free minority carriers can be reduced with the aid of radiation.

The existence of such semiconductor materials was proved by experiments made in connection with the invention. These experiments related to a photosensitive semiconductor body of gallium phosphide which had a p-n junction and the p-type portion of which was doped with copper. A photocurrent was produced by irradiation with radiation having a wavelength of about 5000 A. The p-type portion of the gallium phosphide body was subsequently irradiated with infrared radiation having a wavelength of about 1.2$\mu$. As a result, the photocurrent was greatly reduced. Reductions of the photocurrent to one thousandth part of its initial value were achieved and it was also found that this provided a particularly sensitive method of detecting the presence of infrared radiation.

The infrared radiation having a wavelength of about 1.2$\mu$ has a quantum energy of about 1 electro-volt which is considerably less than the width of the forbidden band (about 2.25 electron-volts) in gallium phosphide. This means that a large output may be derived while the temperature-dependence is small as compared with known devices for detecting infrared radiation by means of a photosensitive semiconductor body which contains a p-n junction, but which has a width of the forbidden band at most equal to the quantum energy of the radiation to be detected, for the output which can be derived increases with increase in the width of the forbidden band while generally the temperature-dependence decreases.

It has further been found that this gallium phosphide body has a wide sensitivity range and is sensitive to infrared and red radiation having a quantum energy between about 0.6 electron-volt and about 2.0 electron-volts.

It would appear that the reduction of the photocurrent by the incident radiation is due to the following processes:

In the p-type portion of the gallium phosphide body the doping with copper gives rise to an acceptor level spaced from the valence band by about 0.57 electron-volt. If, for example, free charge carriers are generated in the p-type portion by means of radiation having a wavelength of about 5000 A., the lifetime of the generated minority carriers (electrons) is determined by the recombination of electrons with holes. This recombination may take place by band-to-band transitions and may also be strongly influenced by recombination centres ("killers"), which generally are present in the semiconductor material, because in practice they are inevitable in the manufacture of gallium phosphide, and which furthermore, if desired, may be intentionally incorporated during manufacture, while the acceptor level produced by copper has substantially no influence upon the recombination because the capture cross-section of the unoccupied copper centres is small for free electrons. The acceptor level produced by copper is, at least largely, not occupied by electrons since the Fermi level lies between the acceptor level and the valence band.

When the p-type portion is irradiated with infrared or red radiation having a quantum energy at least equal to 0.57 electron-volt, electrons are raised from the valence band to the acceptor level by this radiation. As a result the concentration of holes in the valence band increases so that the recombination of electrons with holes is promoted. Consequently, the lifetime of the free electrons (minority carriers) is shortened, which results in a reduction of the photocurrent because the photocurrent produced by irradiation of the p-type portion is proportional to the lifetime of the free electrons.

It will be appreciated that other semiconductor materials and/or impurities may be used in which reduction of the lifetime of minority carriers by irradiation is obtainable similarly to what is found in p-type gallium phosphide doped with copper, while semiconductor materials are also likely to be used in which reduction of the lifetime of minority carriers is obtainable by irradiation but in which processes other than those described take place in the semiconductor material.

In view of the above, an important embodiment of an arrangement according to the invention is characterized in that the p-type portion of the photosensitive semiconductor body which adjoins the p-n junction consists of a semiconductor material in which free charge carriers including minority carriers (electrons) may be generated by means of radiation emitted by the source of radiation, the lifetime of the minority carriers generated depending upon recombination of electrons with holes, while the semiconductor material also contains an acceptor level which has substantially no influence upon this recombination, the Fermi level lying between this acceptor level and the valence band, while the optical signal to be detected consists, at least for a considerable part, of radiation which is capable of raising electrons from the valence band to the acceptor level with the result that the concentration of holes in the valence band is increased, which promotes the recombination of electrons with holes and reduces the lifetime of minority carriers (electrons).

A particularly successful embodiment of an arrangement according to the invention is characterized in that the photosensitive semiconductor body consists of gallium phosphide and, at least in the p-type portion of the photosensitive semiconductor body adjoining the p-n junction, free charge carriers including minority carriers (electrons) can be generated by means of the radiation source, while the p-type portion contains an acceptor level produced by doping with copper, optical signals to be detected being applied to the p-type portion, which signals consist, at least for a substantial part, of radiation having a quantum energy which is at least equal to the distance between the acceptor level and the valence band, which distance is about 0.57 electron-volt.

The radiation source may be any source which emits radiation of the desired wavelength, for example, a tungsten ribbon lamp provided with a monochromator, such as an interference filter. Such filters are readily obtainable commercially. Preferably, however, the radiation source is an injection recombination radiation source, which permits a very compact constructional combination with the photosensitive semiconductor body.

The recombination radiation source may suitably have a semiconductor body of gallium phosphide which contains a p-n junction and of which at least the p-type portion adjoining the p-n junction is doped with zinc.

The radiation source and the photosensitive semiconductor body are preferably combined to form a constructional combination, for example, they may be arranged in a common envelope, and if the radiation source is a recombination radiation source this recombination radiation source and the photosensitive semiconductor body may advantageously have a common semiconductor body. This permits of a very compact construction having few contacts.

The invention also relates to a radiation detector for use in an arrangement according to the invention which is characterized in that the radiation detector comprises a constructional combination of a photosensitive semiconductor body with a p-n junction and a source of radiation, the photosensitive semiconductor body, at least to one side of the p-n junction, consisting of a semiconductor material in which free charge carriers, including minority carriers, may be generated by irradiation by the radiation source, while the lifetime of free minority carriers present in the semiconductor material may be reduced by means of radiation having a wavelength longer than that of the said radiation generating free charge carriers, means being present permitting optical signals to be detected to reach the photosensitive semiconductor body. These means may consist of a lens or window in an envelope of the constructional combination, through which lens or window optical signals to be detected may reach the photosensitive semiconductor body.

In order that the invention may readily be carried into effect, embodiments thereof will now be described, by way of example, with reference to the accompanying drawing, in which.

Figure 1:
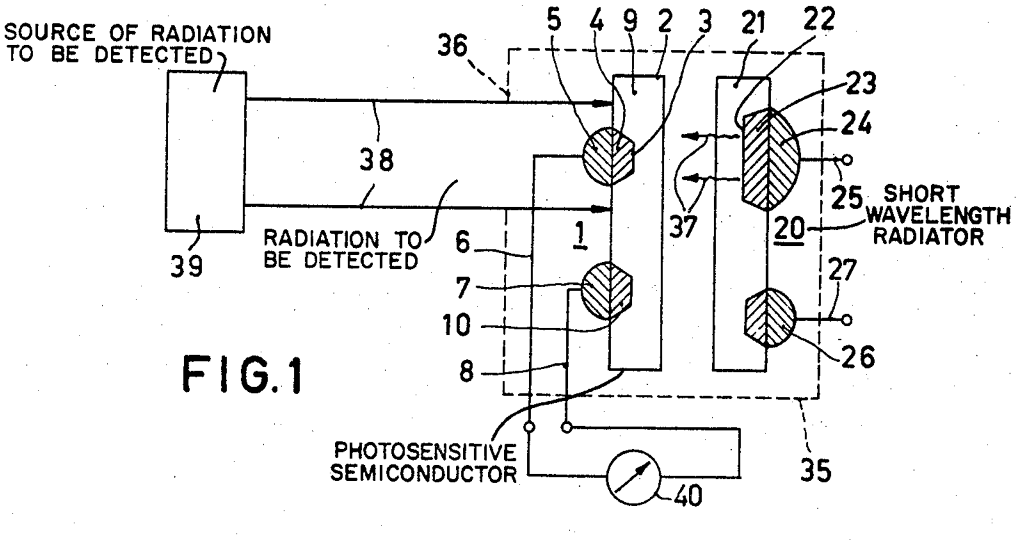
FIG. 1 shows schematically and partly in cross-section an embodiment of an arrangement for detecting radiation according to the invention.

The arrangement for detecting radiation shown in FIG. 1 comprises a radiation detector (1, 20) having a photosensitive semiconductor body 2 which contains a p-n junction 3 and to which radiation 38 to be detected is applied. The photosensitive semiconductor body 2 consists, at least to one side of the p-n junction 3, of a semiconductor material in which free charge carriers including minority carriers may be generated by means of radiation, while the lifetime of the free minority carriers present in the semiconductor material may be reduced by means of radiation having a wavelength longer than that of the radiation which generates free charge carriers, a source of radiation 20 being provided which irradiates the photosensitive semiconductor body 2 with radiation 37 which consists at least for a considerable part of the said radiation which generates free charge carriers, while there are supplied to the photosensitive semiconductor body 2 optical signals 38 which are to be detected and consist, at least for a considerable part, of the said radiation which reduces the lifetime of free minority carriers.

The source of radiation 39 may be any source of which the emitted radiation 38 is to be detected.

In an advantageous embodiment of the device according to the invention the photosensitive semiconductor body 2 consists of gallium phosphide. The photosensitive semiconductor body 2 may have, for example, p-type conductivity while the p-n junction 3 is produced by alloying a contact 5. Free charge carriers, including minority carriers (electrons), may be generated in a p-type portion 9 by means of radiation 37. Since the width of the forbidden band of gallium phosphide is about 2.25 electron-volts, free charge carriers may be generated by radiation 37 which has a wavelength of about 5600 A. If desired, the radiation 37 which generates free charge carriers may have a wavelength materially shorter than 5600 A., for example, a wavelength of about 4400 A. The p-type portion 9 is doped with copper. The copper gives an acceptor level spaced from the valence band by about 0.57 electron-volt. The optical signals 38 to be detected are supplied to the p-type portion 9 and consist, at least for a considerable part, of radiation having a quantum energy which is at least equal to the distance between the acceptor level and the valence band (about 0.57 electron-volt).

The dimensions of the gallium phosphide body 2 may, for example, be about 3 mm. x 3 mm. x 0.2 mm. It may be doped with copper by diffusing copper into the gallium phosphide body 2 at a temperature between about 800° C. and 1000° C. The copper may first be applied to a surface of the gallium phosphide body by deposition from the vapour phase, during which process the gallium-phosphide body may be heated to a temperature between about 350° C. and 500° C.

The contact 5 may be provided by alloying tin at a temperature between about 400° C. and 700° C. during a time which preferably is less than 1 sec. As a result, an n-type recrystallised region 4 and the p-n junction 3 are obtained.

A substantially ohmic contact 7 may be provided by alloying gold which contains about 4% by weight of zinc at the same temperature and during the same period as are employed to provide the tin contact 5. This results in a p-type recrystallised region 10. The contacts 5 and 7 may have a diameter (measured parallel to the surface of the semiconductor body) of about 0.5 mm.

The photosensitive semiconductor body 2 together with the contacts 5 and 7 is denoted by the numeral 1.

The contacts 5 and 7 may be provided with connecting leads 6 and 8 in a manner commonly used in semiconductor technology.

To the leads 6 and 8 may be connected a measuring instrument 40 for measuring the photocurrent.

When the photosensitive semiconductor body 1 is irradiated with the radiation 37, a photocurrent is obtained which is indicated by the measuring instrument 40. If optical signals 38 are then applied to the photosensitive semiconductor body 1, the photocurrent may decrease to about one thousandth part of its initial value. In other words, the photosensitive semiconductor body 1 and the radiation source 20 together constitute a particularly sensitive radiation detector. This radiation detector (1, 20) is sensitive to infrared and red radiation 38 having a quantum energy in the range between about 0.6 electron-volt and 2.0 electron-volts and consequently has a wide sensitivity range. The radiation detector (1, 20) has a particularly small temperature-dependence while large powers may be derived from it. One of the reasons thereof is the large width of the forbidden band (about 2.25 electron-volts) of the gallium phosphide body 2 as compared with the quantum energy (between 0.6 electron-volt and 2.0 electron-volts) of the radiation 38 to be detected.

Figure 2:
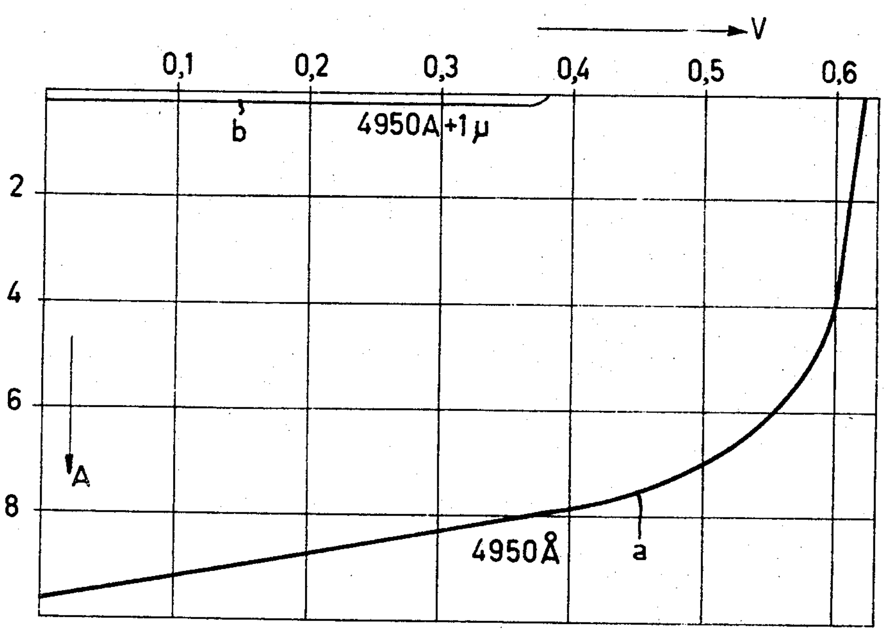
FIG. 2 shows two current-voltage characteristic curves of a photosensitive semiconductor body used in the arrangement shown in FIG. 1, which are obtained on irradiation by different kinds of radiation.

In FIG. 2 curve *a* shows the photocurrent A in arbitrary units as a function of the voltage V in volts generated across the contacts 5 and 7, which photocurrent is obtained on irradiation of the photosensitive semiconductor body 2 with radiation 37 having a wavelength of about 4950 A. The curves are obtained without external biasing, a variable load necessary for such measurements not being shown. When the photosensitive semiconductor body 2 is simultaneously irradiated by radiation 38 having a wavelength of about $1\mu$ (which corresponds to about 1.2 electron-volts) curve *b* is obtained. This shows that the radiation 38 greatly reduces the photocurrent A.

Since the photocurrent is highly dependent upon the lifetime of the minority carriers, it would seem that the infrared or red radiation 38 reduces the lifetime of the electrons in the p-type portion 9 of the gallium phosphide body 2. It is thought that this can be explained in the following manner.

Figure 3:
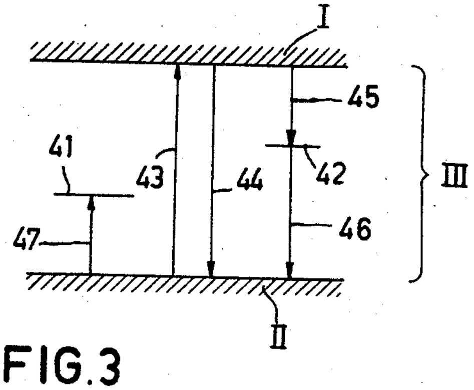
FIG. 3 is an energy diagram of a photosensitive semiconductor body used in an embodiment of an arrangement according to the invention.

The copper gives rise to an acceptor level 41 (FIG. 3) in the forbidden band III spaced by a distance of about 0.57 electron-volt from the valence band II. The semiconductor material has p-type conductivity and consequently there are substantially no electrons (minority carriers) in the conduction band I. Electrons are raised from the valence band II to the conduction band I by means of the radiation 37 (FIG. 1). These transitions are indicated by arrow 43 in FIG. 3. The electrons which are thus transferred to the conduction band I produce the photocurrent, which depends upon the lifetime of these electrons. This lifetime is determined by the rate at which the electrons in the conduction band I recombine with the holes in the valence band II. The electrons may reach the valence band II directly by band-to-band transitions (arrow 44) and/or indirectly by transitions 45 and 46 by way of a level 42 produced by a recombination centre (killer). Generally recombination centres are present in the semiconductor material and, if desired, the concentration of recombination centres may be increased in a known manner.

Recombination may also take place by way of the copper level 41, however, recombination by way of this level 41 is slow compared to recombination by band-to-band transitions (43) and/or recombination by the transitions 45 and 46 by way of the level 42. Consequently, the copper level 41 has substantially no influence upon the recombination and the lifetime of the electrons in the conduction band.

Electrons may be raised from the valence band to the copper level 41 by a transition 47 by means of radiation 38 (FIG. 1) which has a wavelength longer than that of the radiation 37 which generates free charge carriers, but a quantum energy which is at least equal to the distance between the acceptor level 41 produced by copper and the valence band (about 0.57 electron-volt). Thus, the concentration of holes in the valence band is increased and, since the recombination rate is also dependent upon the concentration of holes in the valence band, the recombination between electrons and holes is accelerated, which shortens the lifetime of the electrons in the conduction band. It has been found that actually the photocurrent is reducible only by radiation having a quantum energy which is at least equal to about 0.57 electron-volt.

To enable electrons to be raised to the copper level 41 by the transition 47 this copper level 41 should, at least for a large part, be unoccupied and hence the Fermi level should lie between the copper level 40 and the valence band II. As is known, the location of the Fermi level is controllable by controlling the doping of the semiconductor body.

It will be appreciated that in addition to copper-doped p-type gallium phosphide other semiconductor materials and/or impurities may be used in which the lifetime of minority carriers may be shortened by processes of the kind described above. Speaking generally, the following conditions will have been satisfied.

The p-type portion 9 of the photosensitive semiconductor body 2 which adjoins the p-n junction (FIG. 1) will consist of semiconductor material in which free charge carriers, including minority carriers (electrons), may be generated by means of radiation 37 emitted by the radiation source 20, the lifetime of the minority carriers generated being dependent upon recombination of electrons with holes, while the semiconductor material further will contain an acceptor level 41 which substantially does not influence this recombination, the Fermi level being situated between this acceptor level 41 and the valence band II, while the optical signals to be detected will consist of radiation 38 capable of raising electrons from the valence band II to the acceptor level 41, with the result that the concentration of holes in the valence band II is increased, which promotes the recombination of electrons in the holes and reduces the lifetime of the minority carriers (electrons).

The radiation source 20 preferably is an injection recombination radiation source which provides the desired recombination radiation 37. The injection recombination radiation source 20 may be a gallium phosphide body 21 of about 3 mm. x 3 mm. x 0.2 mm. which by doping with zinc shows p-type conductivity. The n-type recrystallised region 23 and the p-n junction 22 are obtained by alloying a tin contact 24 at a temperature between about 400° C. and 700° C. during a time which preferably is less than 1 sec. The tin contact 24 may have a diameter of about 1.5 mm. A substantially ohmic contact 26 having a diameter of, for example, 0.5 mm. is obtained by alloying gold containing about 4% by weight of zinc under the same conditions under which the tin contact 24 is alloyed. The contacts 24 and 26 are provided with leads 25 and 27 by a known method.

If a forward current is caused to flow across the p-n junction 22 through the leads 25 and 27, a recombination radiation 37 having a wavelength of about 5600 A. is produced which is capable of generating free holes and electrons in the p-type portion 9 of the gallium phosphide body 2.

It should be noted that, if desired, the radiation source 20 may be an injection recombination laser.

The photosensitive semiconductor body 2 provided with the contacts 5 and 7 and the radiation source 20, which together form a radiation detector (1, 20), preferably are combined to form a constructural combination. For example, a common envelope (indicated by a dashed line 35) may be present. The constructural combination contains means, such as an aperture 36 in the envelope 35 in which a window or lens may be mounted, which permit of applying to the photosensitive semiconductor body 2 optical signals 38 to be detected.

Figure 4:
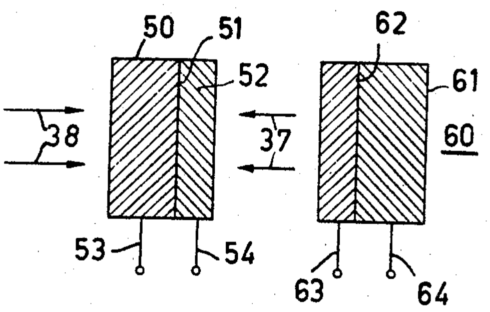
FIG. 4 is a schematic cross-sectional view of an embodiment of a photosensitive semiconductor body together with an injection recombination radiation source.

In the embodiment described with reference to FIG. 1 the p-n junctions 3 and 22 are obtained by alloying the contacts 5 and 24, respectively. As an alternative, p-n junctions may be used which are obtained by diffusion and/or epitaxial methods. An embodiment which comprises a photosensitive semiconductor body 50 provided with a p-n junction 51 by diffusion or epitaxial methods and an injection recombination radiation source 60 having a semiconductor body 61 which likewise is provided with a p-n junction 62 by diffusion or epitaxial methods, is shown schematically in FIG. 4. The radiation to be detected is denoted by numeral 38 and the radiation of the radiation source 60 by numeral 37.

The photosensitive semiconductor body 50 may again consist of copper-doped gallium phosphide while an n-type epitaxial gallium phosphide layer 52, which may be doped with oxygen, is applied to this p-type body 50 by a method commonly used in semiconductor technology, with the result that a p-n junction 51 is obtained. The body 50 and the layer 51 are provided with connecting leads 53 and 54, respectively.

The p-n junction 51 may alternatively be obtained by diffusion of an impurity into the photosensitive semiconductor body. For example, copper may be diffused into an n-type gallium-phosphide body at a temperature between about 800° C. and 1000° C.

The semiconductor body 61 of the radiation source 60 may be, for example, an n-type gallium-phosphide body in which a p-n junction 62 is produced by diffusion of zinc at a temperature of about 900° C. In this case also, the p-n junction 62 may alternatively be obtained by an epitaxial method. The radiation source 60 is provided with connecting leads 63 and 64.

The photosensitive semiconductor body 50 and the radiation source 60 preferably are again combined to form a constructional entity and may have a common envelope.

Figure 5:
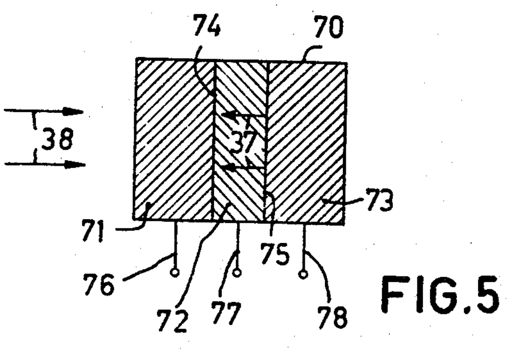
FIG. 5 is a schematic cross-sectional view of an embodiment of a photosensitive semiconductor body together with an injection recombination radiation source which have a common semiconductor body.

The photosensitive semiconductor body 50 and the semiconductor body 61 of the radiation source 60 may advantageously form part of a common semiconductor body. An embodiment including such a common semiconductor body 70 is shown schematically in FIG. 5.

A semiconductor body 70 is made of gallium phosphide and has a copper-doped p-type zone 71, an n-type zone 72, which may be doped with oxygen, and a zinc-doped p-type zone 73. Furthermore, there are two p-n junctions 74 and 75, while the zones 71, 72 and 73 are provided with connecting leads 76, 77 and 78, respectively. The zones 71 and 73 may be obtained by diffusion of copper and zinc, respectively, into the initial n-type semiconductor body 70.

The p-n junction 75 is biased in the forward direction through the leads 77 and 78, with the result that a combination radiation 37 having a wavelength of about 5600 A. is obtained. The photocurrent which appears at the p-n junction 74 is derived through the leads 76 and 77. This photocurrent may be reduced by radiation 38 to be detected.

It will be appreciated that the invention is not limited to the embodiments described and that a person skilled in the art may make many modifications without departing from the scope of the invention. For example, a photocurrent generated in the photosensitive semiconductor body 2 (FIG. 1) by the radiation source 20 may be compensated for by a voltage source which together with the measuring instrument 40 is connected to the leads 6 and 8, with the result that the measuring instrument 40 indicates no current. In this case, the signals 38 to be detected reduce the photocurrent to be compensated so that the voltage source causes a current to flow which is indicated by the measuring instrument 40. Thus, the detection of radiation results in an increase of the current indicated by the measuring instrument 40 instead of a decrease. Furthermore, semiconductor surfaces which are struck by radiation and/or surfaces through which radiation is to emanate from a semiconductor body may be provided with anti-reflection layers commonly used in optics. In addition, free charge carriers may be generated in the photosensitive semiconductor body not owing to band-to-band transitions but by raising electrons from the valence band to the conduction band in two transition steps by way of an additional intermediate level situated in the forbidden band.

What is claimed is:

1. A detector for long wavelength radiation comprising a body of a photosensitive semiconductor material, a portion of said body being of n-type conductivity and an adjacent portion of said body being of p-type conductivity forming with the n-type portion a p-n junction, said semiconductor material being responsive to relatively short wavelength radiation for generating free charge carriers including minority carriers of a certain lifetime and further including means for reducing the lifetime of said generated minority carriers in response to longer wavelength radiation, connections to said p-type and n-type portions to form an output circuit, a radiation source for irradiating the photosensitive body with said short wavelength radiation thus generating free minority carriers increasing the electrical output in said output circuit, said body being positioned to receive the said longer wavelength radiation thereby reducing the minority carrier lifetime and thus the electrical output in the output circuit, and means in the output circuit for indicating the reduction of the electrical output as an indication of the intensity of said longer wavelength radiation.

2. A detector as set forth in claim 1 wherein the radiation source is an injection recombination radiation source.

3. A detector for long wavelength radiation comprising a body of a photosensitive semiconductor material having valence and conduction bands separated by a forbidden band gap, a portion of said body being of n-type conductivity and an adjacent portion of said body being of p-type conductivity forming with the n-type portion a p-n junction, the p-type portion of said semiconductor material exhibiting the property of generating free electrons when subjected to one radiation of an energy greater than that of said band gap and being doped to provide acceptor levels which have no substantial effect on the recombination rate of the free electrons, the Fermi level in said p-type portion lying between the acceptor levels and the valence band and the acceptor levels being far enough above the valence band so that they will be substantially unoccupied in the absence of the long wavelength radiation, connections to said p-type and n-type portions to form an output circuit, a radiation source for irradiating the p-type portion of the photosensitive body with said one radiation thus generating free electrons increasing the electrical output in said output circuit, said long wavelength radiation to be detected having an energy content capable of raising electrons from the valence band to the said acceptor levels thereby increasing the concentration of free holes in the valence band thereby reducing the lifetime of the free electrons by promoting their recombination with the free holes, said long wavelength radiation being insufficient to cause transitions from the valence to the conduction band, said body being positioned to receive the said long wavelength radiation thereby reducing the free electron lifetime and thus the electrical output in the circuit, and means in the output circuit for indicating the reduction of the electrical output as an indication of the intensity of said long wavelength radiation.

4. A detector as set forth in claim 3 wherein the semiconductor body is of gallium phosphide, the p-type portion is doped with copper to provide the acceptor levels, and the long wavelength radiation to be detected has an energy content at least equal to 0.57 electron-volt.

5. A detector as set forth in claim 4 wherein the radiation source comprises a body of gallium phosphide having adjacent p- and n-type regions forming a p-n junction with the p-type region doped with zinc.

References Cited

UNITED STATES PATENTS

| | | | |
|---|---|---|---|
| 2,582,850 | 1/1952 | Rose | 317—235.27 |
| 2,995,660 | 8/1961 | Lempicki | 250—83.3 |
| 3,043,958 | 7/1962 | Diemer | 250—217 |
| 3,304,429 | 2/1967 | Bonin et al. | 250—211 |

RALPH G. NILSON, *Primary Examiner.*

T. N. GRIGSBY, *Assistant Examiner.*